(12) United States Patent
Ko et al.

(10) Patent No.: US 12,401,347 B2
(45) Date of Patent: Aug. 26, 2025

(54) PULL-UP VOLTAGE DETECTION CIRCUIT AND PULL-UP VOLTAGE DETECTION METHOD

(71) Applicant: Richtek Technology Corporation, Zhubei (TW)

(72) Inventors: Chien-Tzu Ko, Pingtung (TW); Jiun-Jang Lin, Taichung (TW); Yan-Jhen Huang, Chiayi (TW); Jhen-Yu Li, Kaohsiung (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 122 days.

(21) Appl. No.: 18/539,356

(22) Filed: Dec. 14, 2023

(65) Prior Publication Data
US 2024/0213963 A1    Jun. 27, 2024

Related U.S. Application Data

(60) Provisional application No. 63/476,987, filed on Dec. 23, 2022.

(30) Foreign Application Priority Data

Feb. 22, 2023   (TW) .................................. 112106425

(51) Int. Cl.
*H03K 19/00* (2006.01)
*H03K 3/0233* (2006.01)
(Continued)

(52) U.S. Cl.
CPC ......... *H03K 3/02332* (2013.01); *H03K 5/082* (2013.01); *H03K 5/249* (2013.01); *H03K 19/17728* (2013.01)

(58) Field of Classification Search
CPC .... H03K 3/02332; H03K 5/082; H03K 5/249; H03K 19/17728; H03K 19/017509; G06F 13/4282
See application file for complete search history.

(56) References Cited

U.S. PATENT DOCUMENTS 5,528,754 A * 6/1996 Okamoto ................ H04L 69/40
714/43
6,650,174 B2 * 11/2003 Bell .................. H03K 19/01721
327/540
(Continued)

FOREIGN PATENT DOCUMENTS

CN            112650377 A       4/2021

*Primary Examiner* — Tuan T Lam
(74) *Attorney, Agent, or Firm* — Tung & Associates

(57) ABSTRACT

A pull-up voltage detection circuit is for use in a serial bus. The serial bus includes a communication signal. During a communication interval, the communication signal is toggled based on a pull-up voltage for communicating on the serial bus via open-drain scheme. The pull-up voltage detection circuit includes: at least one comparator circuit for comparing the communication signal or a divided voltage thereof with at least one reference voltage in a detection procedure, so as to generate at least one comparison result; and a selector circuit for selecting one of plural predetermined voltages according to the at least one comparison result. The selected predetermined voltage serves as a logic threshold voltage corresponding to the pull-up voltage. In the communication interval, the logic state of the communication signal is determined by comparing the communication signal and the logic threshold voltage for communicating on the serial bus.

22 Claims, 6 Drawing Sheets

(51) Int. Cl.
  *H03K 5/08* (2006.01)
  *H03K 5/24* (2006.01)
  *H03K 19/17728* (2020.01)

(56) References Cited

U.S. PATENT DOCUMENTS 6,857,040 B2 * 2/2005 Noonan .............. G06F 13/4027
                                                        710/306
7,692,450 B2 * 4/2010 Aranovsky .... H03K 19/018521
                                                        326/88

* cited by examiner

PULL-UP VOLTAGE DETECTION CIRCUIT AND PULL-UP VOLTAGE DETECTION METHOD

CROSS REFERENCE

The present invention claims priority to U.S. 63/476,987 filed on Dec. 23, 2022 and claims priority to TW 112106425 filed on Feb. 22, 2023.

BACKGROUND OF THE INVENTION

Field of Invention

The present invention relates to a pull-up voltage detection circuit; particularly, it relates to such pull-up voltage detection circuit capable of automatically detecting a pull-up voltage. The present invention also relates to a pull-up voltage detection method.

Description of Related Art

An I2C bus is a globally recognized standard that can be implemented on different ICs manufactured by thousands of companies. A simplified form of I2C configuration is shown in FIG. 1, wherein a pull-up voltage VDD is required to provide a pull-up rail for open-drain circuits for communicating on the I2C bus. Under different pull-up voltages VDD, the I2C bus logic threshold voltage needs to be correspondingly changed. Common pull-up voltages include 5V, 3.3V, 1.8V and 1.2V. However, it is difficult to design a circuit that can meet different logic threshold voltage specifications under different pull-up voltages VDD. To solve this issue of meeting different logic threshold voltage specifications under different pull-up voltages, in the past, an IC provider provides different models of IC chips with different eFuse settings; however, this will undesirably generate inventory management issues and more management efforts.

In view of the above, to overcome the drawback in the prior art, the present invention proposes a pull-up voltage detection circuit capable of automatically detecting a pull-up voltage.

SUMMARY OF THE INVENTION

From one perspective, the present invention provides a pull-up voltage detection circuit, located in an integrated circuit and for use in a serial bus, wherein the serial bus includes a communication signal, wherein during at least one communication interval, the communication signal is toggled via open drain scheme based on a pull-up voltage for communicating on the serial bus, wherein the pull-up voltage is coupled to the serial bus external to the integrated circuit, wherein the pull-up voltage has plural pull-up voltage levels according to a specification compliant to the serial bus; the pull-up voltage detection circuit comprising: at least one comparator circuit, which is configured to operably compare the communication signal or a divided voltage thereof with at least one reference voltage in a detection procedure, so as to generate at least one comparison result; and a selector circuit, which is configured to operably select one of at least two predetermined voltages according to the at least one comparison result, wherein the selected predetermined voltage serves as a logic threshold voltage corresponding to the pull-up voltage; wherein in the at least one communication interval, a logic state of the communication signal is determined by comparing the communication signal and the logic threshold voltage for communicating on the serial bus.

In one embodiment, the pull-up voltage detection circuit further comprises: a logic circuit; wherein the at least one comparator circuit includes at least two comparator circuits, wherein the at least one comparison result includes at least two comparison results; wherein the logic circuit is configured to operably generate a determination signal according to the at least two comparison results; wherein the selector circuit is configured to operably select one of the at least two predetermined voltages according to the determination signal, so that the selected predetermined voltage serves as the logic threshold voltage.

In one embodiment, the at least one reference voltage includes at least two reference voltages, and each of the at least two comparator circuits is configured to operably compare the communication signal or the divided voltage thereof with the corresponding reference voltage in the detection procedure, so as to generate the corresponding comparison result.

In one embodiment, a default predetermined voltage of the logic threshold voltage is a smallest one of the at least two predetermined voltages.

In one embodiment, when the communication signal or the divided voltage thereof is lower than the corresponding reference voltage, the corresponding comparison result is indicated as a first binary code, whereas, when the communication signal or the divided voltage thereof is not lower than the corresponding reference voltage, the corresponding comparison result is indicated as a second binary code; wherein the at least two comparison results are combined to constitute a binary number, so that the binary number serves as the determination signal, and wherein the selector circuit is configured to operably select the corresponding predetermined voltage according to the binary number, so that the selected corresponding predetermined voltage serves as the logic threshold voltage.

In one embodiment, a lowest bit of the binary number corresponds to a smallest one of the at least two reference voltages, whereas, a highest bit of the binary number corresponds to a greatest one of the at least two reference voltages; and wherein each bit of the binary number corresponds to one of the at least two corresponding reference voltages in a lowest-to-highest order of correspondence.

In one embodiment, among the bits of the binary number, when a relatively higher bit is the second binary code and when a relatively lower bit is the first binary code, the detection procedure is reset.

In one embodiment, the pull-up voltage detection circuit further comprises: a logic circuit; wherein the at least one comparator circuit includes a single comparator circuit, wherein the at least one comparison result includes a single comparison result, and wherein the at least one reference voltage includes at least two reference voltages; wherein the logic circuit is configured to operably generate plural reference voltage selection signals sequentially based on a predetermined searching method, wherein the plural reference voltage selection signals select the at least two reference voltages for being compared with the communication signal or the divided voltage thereof sequentially, so as to generate correspondingly a plurality of the comparison results, wherein a determination signal is generated according to the plurality of the comparison results; wherein the selector circuit is configured to operably select one of the at least two predetermined voltages according to the determination signal, so that the selected predetermined voltage serves as the logic threshold voltage.

In one embodiment, the detection procedure is operated during at least one of the following intervals: an interval, in which the serial bus is not conducting communication, lying before the serial bus starts conducting a first communication interval and after a power on reset procedure; or an interval, in which the serial bus is not conducting communication, lying between two of the communication intervals in which the serial bus is conducting communication.

In one embodiment, the pull-up voltage detection circuit further comprises: a de-bounce circuit coupled to at the least one comparator circuit, wherein the de-bounce circuit is configured to operably execute a de-bounce operation on the at least one comparison result.

In one embodiment, each pull-up voltage level of the plural pull-up voltage levels has a corresponding upper limit voltage and a lower limit voltage, wherein a pull-up voltage range corresponding to each pull-up voltage level is defined between the upper limit voltage and the lower limit voltage, wherein each reference voltage in at least one reference voltage falls within the range of two corresponding adjacent pull-up voltage ranges.

In one embodiment, the serial bus is I2C (Inter-Integrated Circuit) bus.

From another perspective, the present invention provides a pull-up voltage detection method, for use in a serial bus, wherein the serial bus includes a communication signal, wherein during at least one communication interval, the communication signal is toggled via open drain scheme based on a pull-up voltage for communicating on the serial bus, wherein the pull-up voltage has plural pull-up voltage levels according to a specification compliant to the serial bus; the pull-up voltage detection method comprising: comparing the communication signal or a divided voltage thereof with at least one reference voltage in a detection procedure, so as to generate at least one comparison result; and selecting one of at least two predetermined voltages according to the at least one comparison result, wherein the selected predetermined voltage serves as a logic threshold voltage corresponding to the pull-up voltage; wherein in the at least one communication interval, a logic state of the communication signal is determined by comparing the communication signal and the logic threshold voltage for communicating on the serial bus.

Advantages of the present invention include: that, the pull-up voltage detection circuit of the present invention can automatically detect a pull-up voltage; and that, the present invention can enable, disable or change a reference voltage at any moment; and that, it is not required for the present invention to be set up; and that, the present invention does not require an extra pin.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies. For better understanding the essence of the present invention, practical implementation details will be described in the embodiments below. It should be understood that such details are not for limiting the broadest scope of the present invention.

Figure 1:
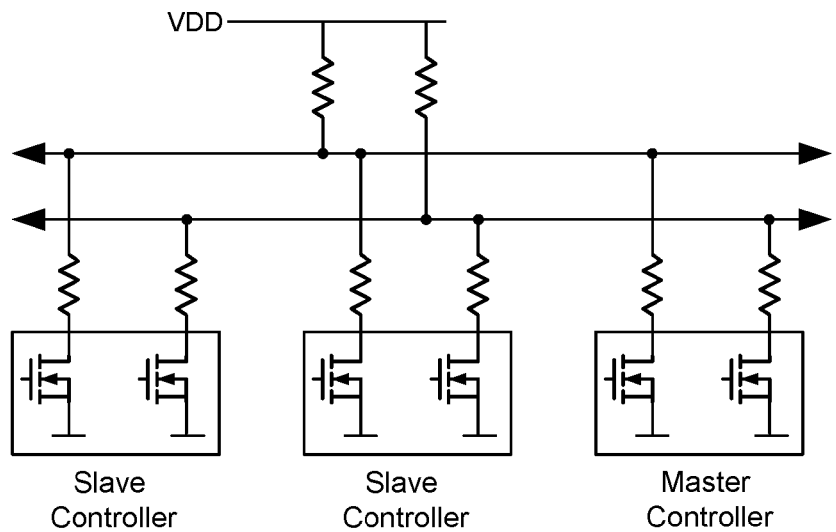
FIG. 1 shows a schematic circuit diagram of a conventional I2C bus circuit.
Figure 2:
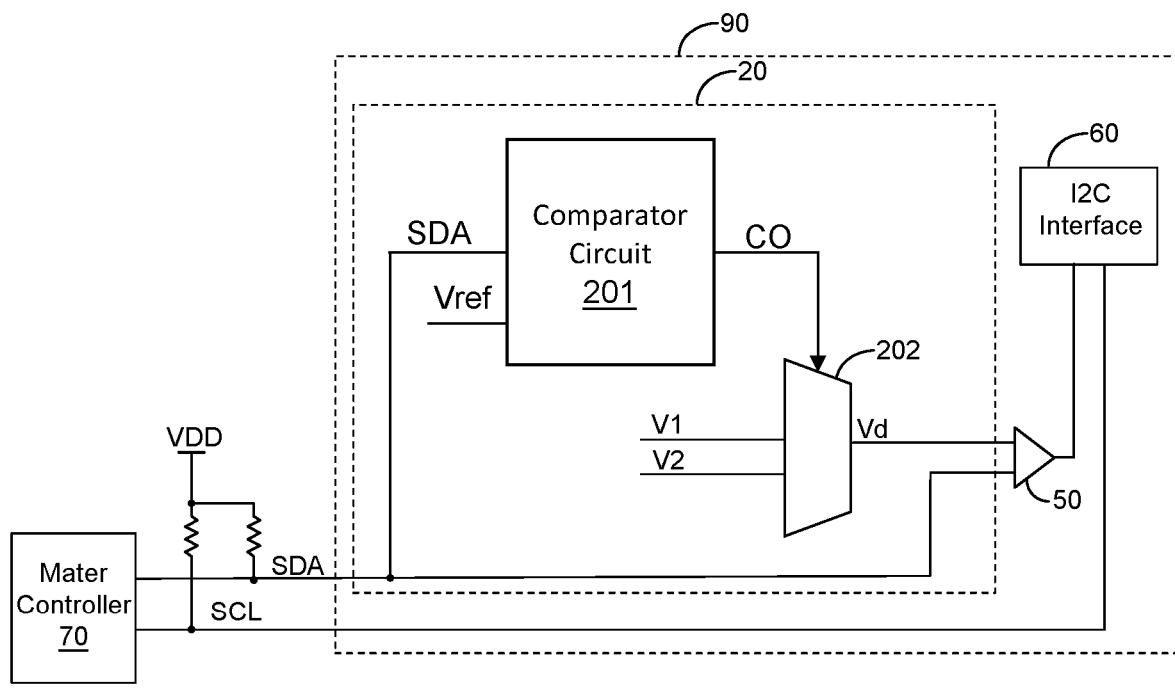
FIG. 2 shows a schematic circuit diagram of a pull-up voltage detection circuit according to an embodiment of the present invention.

FIG. 2 shows a schematic circuit diagram of a pull-up voltage detection circuit according to an embodiment of the present invention. For better understanding, FIG. 2 also illustrates the master controller 70, the input comparator 50, and I2C interface 60. In one embodiment, the pull-up voltage detection circuit 20, the input comparator 50, and the I2C interface 60 are integrated into the integrated circuit 90. Please also refer to FIG. 8, where, during at least one communication interval, a sender on the I2C bus, such as the master controller 70, toggles to communicate based on a pull-up voltage VDD using an open-drain circuit. The input comparator 50 compares the communication signal (e.g., I2C bus data signal SDA) with the logic threshold voltage Vd to determine the logic state of the communication signal SDA, converting it into a digital signal to be transmitted to the I2C interface 60. This facilitates communication between the master controller 70 and the I2C interface 60 on the I2C bus. In one embodiment, the pull-up voltage VDD, according to the specifications of the I2C bus, may include multiple different voltages such as 5V, 3.3V, 1.8V, and 1.2V. The pull-up voltage detection circuit 20, as shown in FIG. 2, detects a pull-up voltage level of the pull-up voltage in the detection procedure and adaptively selects the corresponding logic threshold voltage Vd. The pull-up voltage VDD is externally coupled to the integrated circuit 90 through a pull-up resistor connected to the bus, as illustrated in FIG. 2.

Note that, the clock signal SCL of the I2C bus can also be adaptively adjusted for the corresponding logic threshold voltage in a similar manner.

As shown in FIG. 2, the pull-up voltage detection circuit 20 of the present invention comprises: at least one comparator circuit 201 and a selector circuit 202. The at least one comparator circuit 201 is configured to operably compare a communication signal SDA or a divided voltage thereof with at least one reference voltage Vref in a detection procedure, to generate at least one comparison result CO. The selector circuit 202 is configured to operably select one of at least two predetermined voltages (e.g., V1 and V2) according to the at least one comparison result CO, wherein the selected predetermined voltage serves as a logic threshold voltage Vd for use in an I2C bus.

Figure 3:
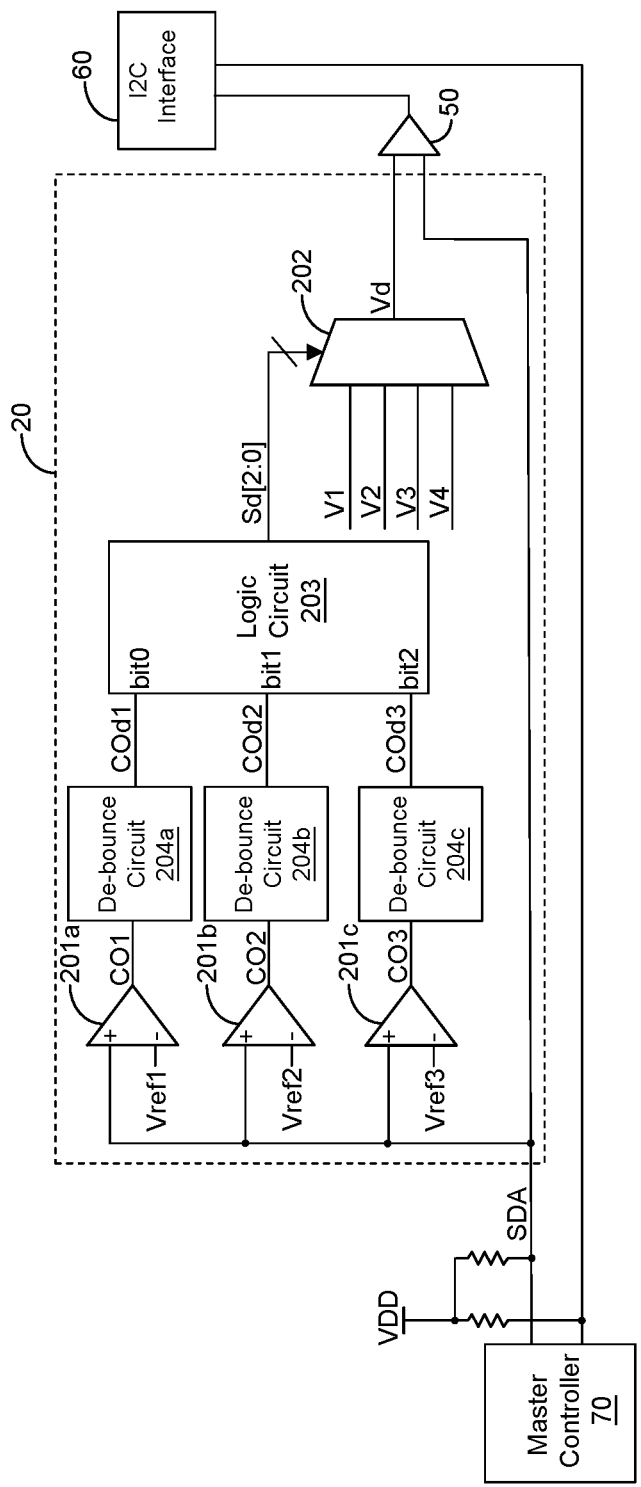
FIG. 3 shows a schematic circuit diagram of a pull-up voltage detection circuit according to another embodiment of the present invention.

FIG. 3 shows a schematic circuit diagram of a pull-up voltage detection circuit according to another embodiment of the present invention. FIG. 3 is a specific embodiment of FIG. 2. As shown in FIG. 3, the pull-up voltage detection circuit 20 of this embodiment includes at least two comparator circuits, which are, for example but not limited to, a comparator circuit 201a, a comparator circuit 201b and a comparator circuit 201c. Each of the comparator circuits 201a, 201b and 201c is configured to operably compare a communication signal SDA or a divided voltage thereof with a corresponding reference voltage (for example but not limited to the reference voltage Vref1, Vref2 or Vref3) in a detection procedure, so as to generate a corresponding comparison result (for example but not limited to the comparison result CO1, CO2 or CO3, at least two comparison results in total). The pull-up voltage detection circuit 20 of this embodiment further comprises: at least one de-bounce circuit 204a, 204b and 204c, wherein the at least one de-bounce circuit 204a, 204b and 204c are coupled to the at least one comparator circuit 201a, 201b and 201c, respectively. The at least one de-bounce circuit 204a, 204b and 204c are configured to respectively execute a de-bounce operation on the corresponding comparison result CO1, CO2 and CO3, so as to generate de-bounced comparison results COd1, COd2 and COd3, respectively.

The pull-up voltage detection circuit 20 of this embodiment further comprises a logic circuit 203, which is configured to operably generate a determination signal Sd[2:0] according to the at least two comparison results (in this embodiment, the de-bounced comparison results COd1, COd2 and COd3). The selector circuit 203 is configured to operably select one of the predetermined voltages (in this embodiment, the predetermined voltages V1, V2, V3 and V4) according to the determination signal Sd[2:0], so that the selected predetermined voltage serves as the logic threshold voltage Vd for use in the I2C bus. The default predetermined voltage of the logic threshold voltage Vd is the smallest one of the at least two predetermined voltages (in this embodiment, the smallest one of the predetermined voltages V1, V2, V3 and V4). When the communication signal SDA or the divided voltage thereof is lower than the corresponding reference voltage (in this embodiment, Vref1, Vref2 or Vref3), the corresponding comparison result (in this embodiment, the comparison result CO1, CO2 or CO3) is indicated as a binary code "0", whereas, when the communication signal SDA or the divided voltage thereof is not lower than the corresponding reference voltage (in this embodiment, Vref1, Vref2 or Vref3), the corresponding comparison result (in this embodiment, the comparison result CO1, CO2 or CO3) is indicated as a binary code "1". The at least two comparison results are combined to constitute a binary number, and the binary number is the determination signal Sd[2:0]. The selector circuit 203 is configured to select the corresponding predetermined voltage according to the binary number, and the selected predetermined voltage serves as the logic threshold voltage Vd for use in the I2C bus. In one embodiment, the lowest bit of the binary number corresponds to the smallest one of the plural reference voltages V1, V2, V3 and V4. In one embodiment, the highest bit of the binary number corresponds to the greatest one of the plural reference voltages V1, V2, V3 and V4. In one embodiment, each bit of the binary number corresponds one corresponding reference voltage, in a lowest-to-highest order in correspondence. In one embodiment, among the bits of the binary number, when a relatively higher bit is the binary code "1" and when a relatively lower bit is the binary code "0", the detection procedure is reset. From one perspective, the determination signal Sd[2:0] is encoded with a thermometer coding.

Figure 4:
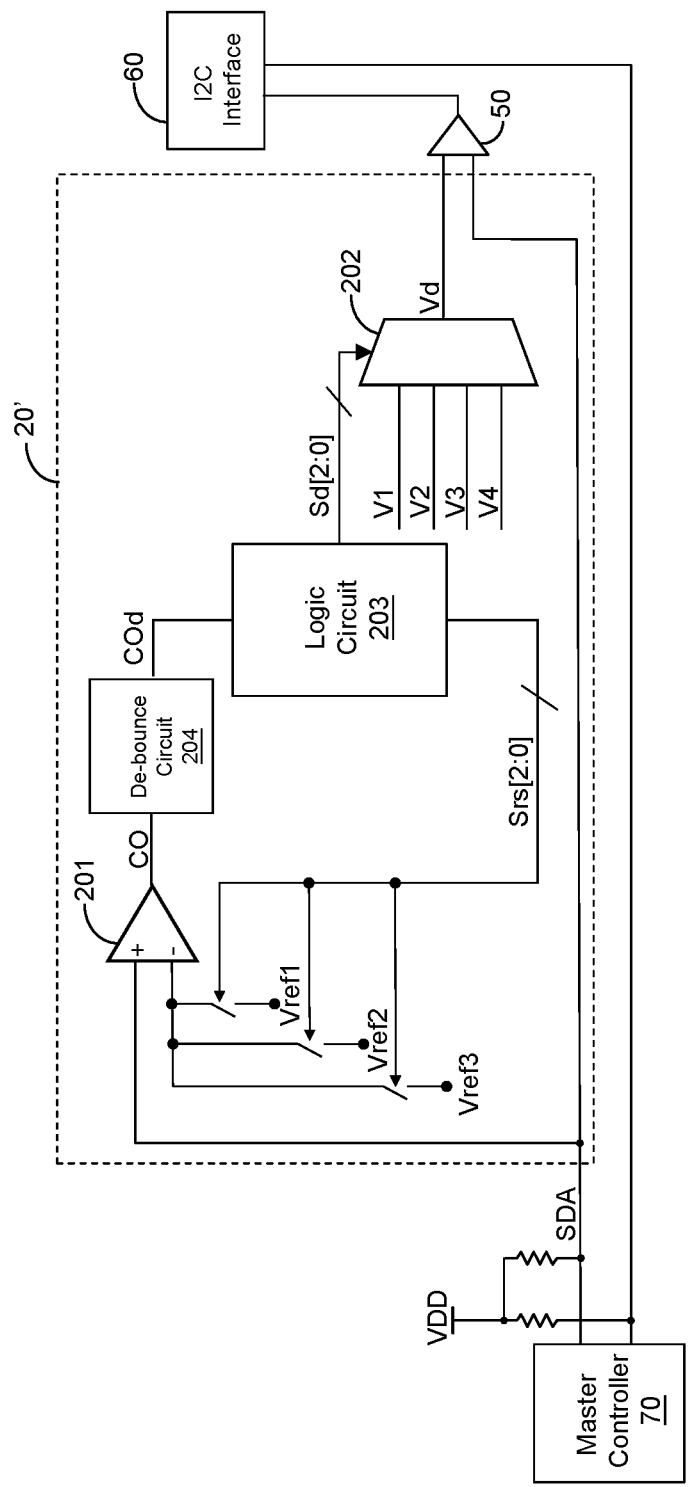
FIG. 4 shows a schematic circuit diagram of a pull-up voltage detection circuit according to yet another embodiment of the present invention.

FIG. 4 shows a schematic circuit diagram of a pull-up voltage detection circuit according to yet another embodiment of the present invention. The pull-up voltage detection circuit 20' of this embodiment shown in FIG. 4 is similar to the pull-up voltage detection circuit 20 of the embodiment shown in FIG. 3, but is different in that: this embodiment adopts a single comparator circuit 201 to separately compare the communication signal SDA or the divided voltage thereof with different reference voltages (in this embodiment, Vref1, Vref2 or Vref3) at different time points sequentially. As shown in FIG. 4, in one embodiment, the single comparator circuit 201 separately selects different reference voltages (in this embodiment, Vref1, Vref2 or Vref3) at different time points in a linear, non-linear or binarization order, to individually compare the communication signal SDA or the divided voltage thereof with different reference voltages at different time points to generate the corresponding comparison result CO. The comparison result CO is de-bounced, and the logic circuit 203 generates the determination signal Sd[2:0] according to the de-bounced comparison results Cod which are obtained at different time points. More specifically, as shown in FIG. 4, the logic circuit 203 sequentially generates the reference voltage selection signal Srs[2:0] based on the comparison result CO, so as to sequentially selects the corresponding reference voltage Vref1, Vref2, or Vref3 to input the comparitor circuit 201. The selected reference voltages are sequentially with the communication signal SDA or the divided voltage thereof, generating comparison results CO in sequence. Subsequently, based on the sequentially obtained comparison results CO, the determination signal Sd[2:0] is generated. The selection circuit 202, according to the determination signal Sd[2:0], chooses one of at least two predefined voltages V1, V2, V3, and V4 as the logic threshold voltage Vd for the I2C bus.

Figure 5:
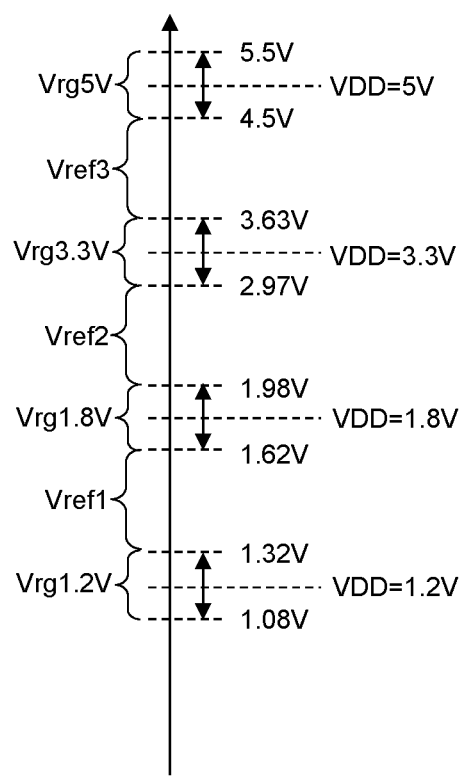
FIG. 5 shows a schematic diagram of an exemplary arrangement of the reference voltages shown in FIG. 3 or FIG. 4 according to an embodiment of the present invention.

In one embodiment, each pull-up voltage has a corresponding upper limit voltage and a lower limit voltage. For example, as shown in FIG. 5, when the pull-up voltage VDD is 5V, it has an upper limit voltage of 5.5V and a lower limit voltage of 4.5V. When the pull-up voltage VDD is 3.3V, it has an upper limit voltage of 3.63V and a lower limit voltage of 2.97V, and so forth. A pull-up voltage range corresponding to each pull-up voltage is defined between its corresponding upper limit voltage and lower limit voltage. For instance, when the pull-up voltage VDD is 5V, the corresponding pull-up voltage range is Vrg5V (between 4.5V and 5.5V), and when the pull-up voltage VDD is 3.3V, the corresponding pull-up voltage range is Vrg3.3V (between 2.97V and 3.63V), and so forth. As illustrated in FIG. 5, each reference voltage falls within the range of two corresponding adjacent pull-up voltage ranges. For example, reference voltage Vref3 falls between the pull-up voltage ranges Vrg5V and Vrg3.3V, and reference voltage Vref2 falls between the pull-up voltage ranges Vrg3.3V and Vrg1.8V, and so forth.

Figure 6:
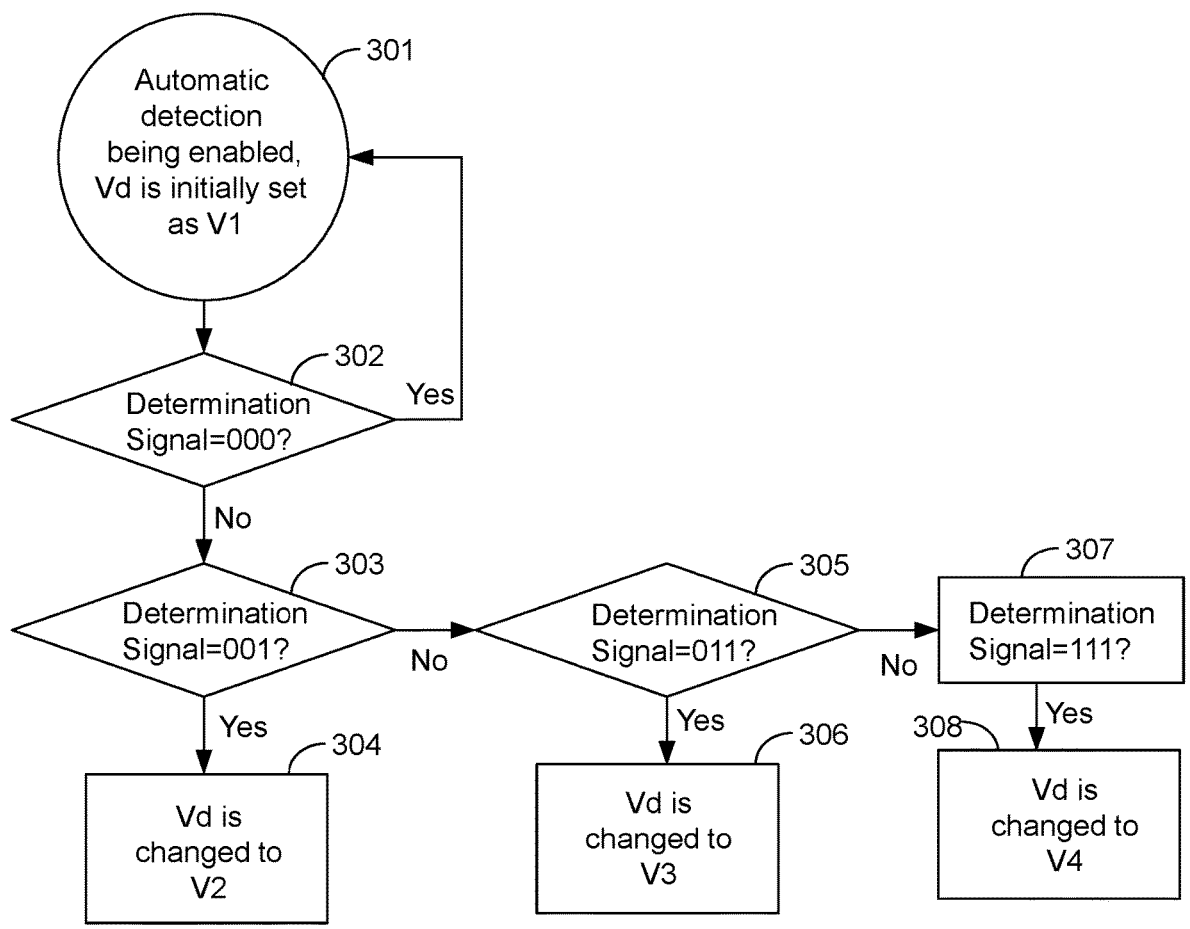
FIG. 6 is a process flow implemented by a pull-up voltage detection circuit according to an embodiment of the present invention.

FIG. 6 is a process flow implemented by a pull-up voltage detection circuit according to an embodiment of the present invention. Please refer to FIG. 6 along with FIG. 3. In step 301, the function of automatic detection of the pull-up voltage detection circuit 20 is enabled, and the logic threshold voltage Vd is initially set as the voltage V1. Next, proceeding to step 302, it is determined whether the determination signal generated by the logic circuit 203 is "000". If the result of step 302 is yes, proceeding back to step 301. If the result of step 302 is no, proceeding to step 303. In step 303, it is determined whether the determination signal generated by the logic circuit 203 is "001". If the result of step 303 is yes, proceeding to step 304. If the result of step 303 is no, proceeding to step 305. In step 304, the logic threshold voltage Vd is changed to the predetermined voltage V2. In step 305, it is determined whether the determination signal generated by the logic circuit 203 is "011". If the result of step 305 is yes, proceeding to step 306. If the result of step 305 is no, proceeding to step 307. In step 306, the logic threshold voltage Vd is changed to the predetermined voltage V3. In step 307, it is determined whether the determination signal generated by the logic circuit 203 is "111". If the result of step 307 is yes, proceeding to step 308. In step 308, the logic threshold voltage Vd is changed to the predetermined voltage V4.

Figure 7:
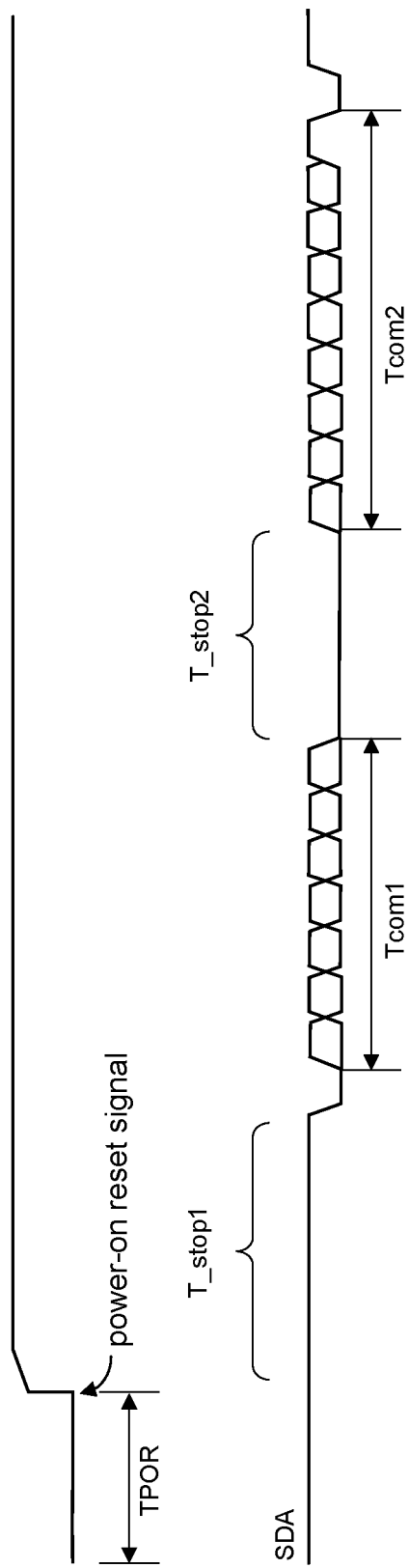
FIG. 7 shows intervals within which the pull-up voltage detection circuit can execute the detection according to an embodiment of the present invention.

FIG. 7 shows intervals within which the pull-up voltage detection circuit can execute the detection according to an embodiment of the present invention. In a preferred embodiment, as shown in FIG. 7, the detection procedure operates during an interval (T_stop1) after the power-on reset interval TPOR and before the start of the first communication interval Tcom1 on the I2 bus, during which no communication on the I2C bus takes place. In another preferred embodiment, the detection procedure operates during an interval (e.g., T_stop2) between any two communication intervals on the I2C bus (such as T_com1 and T_com2).

As described above, the present invention provides a pull-up voltage detection circuit having advantages such as: that the pull-up voltage detection circuit of the present invention can automatically detect a pull-up voltage; and that the present invention can enable, disable or change a reference voltage at any moment; and that it is not required for the present invention to be set up; and that the present invention does not require an extra pin.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A pull-up voltage detection circuit, located in an integrated circuit and for use in a serial bus, wherein the serial bus includes a communication signal, wherein during at least one communication interval, the communication signal is toggled via open drain scheme based on a pull-up voltage for communicating on the serial bus, wherein the pull-up voltage is coupled to the serial bus external to the integrated circuit, wherein the pull-up voltage has plural pull-up voltage levels according to a specification compliant to the serial bus; the pull-up voltage detection circuit comprising:

at least one comparator circuit, which is configured to operably compare the communication signal or a divided voltage thereof with at least one reference voltage in a detection procedure, so as to generate at least one comparison result; and a selector circuit, which is configured to operably select one of at least two predetermined voltages according to the at least one comparison result, wherein the selected predetermined voltage serves as a logic threshold voltage corresponding to the pull-up voltage;

wherein in the at least communication interval, a logic state of the communication signal is determined by comparing the communication signal and the logic threshold voltage for communicating on the serial bus.

2. The pull-up voltage detection circuit as claimed in claim 1, further comprising:

a logic circuit;

wherein the at least one comparator circuit includes at least two comparator circuits, wherein the at least one comparison result includes at least two comparison results;

wherein the logic circuit is configured to operably generate a determination signal according to the at least two comparison results;

wherein the selector circuit is configured to operably select one of the at least two predetermined voltages according to the determination signal, so that the selected predetermined voltage serves as the logic threshold voltage.

3. The pull-up voltage detection circuit as claimed in claim 2, wherein the at least one reference voltage includes at least two reference voltages, and each of the at least two comparator circuits is configured to operably compare the communication signal or the divided voltage thereof with the corresponding reference voltage in the detection procedure, so as to generate the corresponding comparison result.

4. The pull-up voltage detection circuit as claimed in claim 3, wherein a default predetermined voltage of the logic threshold voltage is a smallest one of the at least two predetermined voltages.

5. The pull-up voltage detection circuit as claimed in claim 3, wherein when the communication signal or the divided voltage thereof is lower than the corresponding reference voltage, the corresponding comparison result is indicated as a first binary code, whereas, when the communication signal or the divided voltage thereof is not lower than the corresponding reference voltage, the corresponding comparison result is indicated as a second binary code;

wherein the at least two comparison results are combined to constitute a binary number, so that the binary number serves as the determination signal, and wherein the selector circuit is configured to operably select the corresponding predetermined voltage according to the binary number, so that the selected corresponding predetermined voltage serves as the logic threshold voltage.

6. The pull-up voltage detection circuit as claimed in claim 5, wherein a lowest bit of the binary number corresponds to a smallest one of the at least two reference voltages, whereas, a highest bit of the binary number corresponds to a greatest one of the at least two reference voltages; and
wherein each bit of the binary number corresponds to one of the at least two corresponding reference voltages in a lowest-to-highest order of correspondence.

7. The pull-up voltage detection circuit as claimed in claim 6, wherein among the bits of the binary number, when a relatively higher bit is the second binary code and when a relatively lower bit is the first binary code, the detection procedure is reset.

8. The pull-up voltage detection circuit as claimed in claim 1, further comprising:
a logic circuit;
wherein the at least one comparator circuit includes a single comparator circuit, wherein the at least one comparison result includes a single comparison result, and wherein the at least one reference voltage includes at least two reference voltages;
wherein the logic circuit is configured to operably generate plural reference voltage selection signals sequentially based on a predetermined searching method, wherein the plural reference voltage selection signals select the at least two reference voltages for being compared with the communication signal or the divided voltage thereof sequentially, so as to generate correspondingly a plurality of the comparison results, wherein a determination signal is generated according to the plurality of the comparison results;
wherein the selector circuit is configured to operably select one of the at least two predetermined voltages according to the determination signal, so that the selected predetermined voltage serves as the logic threshold voltage.

9. The pull-up voltage detection circuit as claimed in claim 1, wherein the detection procedure is operated during at least one of the following intervals:
an interval, in which the serial bus is not conducting communication, lying before the serial bus starts conducting a first communication interval and after a power on reset procedure; or
an interval, in which the serial bus is not conducting communication, lying between two of the communication intervals in which the serial bus is conducting communication.

10. The pull-up voltage detection circuit as claimed in claim 1, further comprising:
a de-bounce circuit coupled to at the least one comparator circuit, wherein the de-bounce circuit is configured to operably execute a de-bounce operation on the at least one comparison result.

11. The pull-up voltage detection circuit as claimed in claim 1, wherein each pull-up voltage level of the plural pull-up voltage levels has a corresponding upper limit voltage and a lower limit voltage, wherein a pull-up voltage range corresponding to each pull-up voltage level is defined between the upper limit voltage and the lower limit voltage, wherein each reference voltage in at least one reference voltage falls within the range of two corresponding adjacent pull-up voltage ranges.

12. The pull-up voltage detection circuit as claimed in claim 1, wherein the serial bus is I2C (Inter-Integrated Circuit) bus.

13. A pull-up voltage detection method, for use in a serial bus, wherein the serial bus includes a communication signal, wherein during at least one communication interval, the communication signal is toggled via open drain scheme based on a pull-up voltage for communicating on the serial bus, wherein the pull-up voltage has plural pull-up voltage levels according to a specification compliant to the serial bus; the pull-up voltage detection method comprising:
comparing the communication signal or a divided voltage thereof with at least one reference voltage in a detection procedure, so as to generate at least one comparison result; and
selecting one of at least two predetermined voltages according to the at least one comparison result, wherein the selected predetermined voltage serves as a logic threshold voltage corresponding to the pull-up voltage;
wherein in the at least communication interval, a logic state of the communication signal is determined by comparing the communication signal and the logic threshold voltage for communicating on the serial bus.

14. The pull-up voltage detection method as claimed in claim 13, wherein the at least one reference voltage includes at least two reference voltages, and wherein the at least one comparison result includes at least two comparison results;
wherein the pull-up voltage detection method further comprises:
generating a determination signal according to the at least two comparison results; and
selecting one of the at least two predetermined voltages according to the determination signal, so that the selected predetermined voltage serves as the logic threshold voltage.

15. The pull-up voltage detection method as claimed in claim 14, wherein a default predetermined voltage of the logic threshold voltage is a smallest one of the at least two predetermined voltages.

16. The pull-up voltage detection method as claimed in claim 14, wherein when the communication signal or the divided voltage thereof is lower than the corresponding reference voltage, the corresponding comparison result is indicated as a first binary code, whereas, when the communication signal or the divided voltage thereof is not lower than the corresponding reference voltage, the corresponding comparison result is indicated as a second binary code;
wherein the at least two comparison results are combined constitute a binary number, so that the binary number serves as the determination signal, and wherein the selector circuit is configured to operably select the corresponding predetermined voltage according to the binary number, so that the selected corresponding predetermined voltage serves as the logic threshold voltage.

17. The pull-up voltage detection method as claimed in claim 16, wherein a lowest bit of the binary number corresponds to a smallest one of the at least two reference voltages, whereas, a highest bit of the binary number corresponds to a greatest one of the at least two reference voltages; and
wherein each bit of the binary number corresponds to one of the at least two corresponding reference voltages in a lowest-to-highest order of correspondence.

18. The pull-up voltage detection method as claimed in claim 17, wherein among the bits of the binary number, when a relatively higher bit is the second binary code and when a relatively lower bit is the first binary code, the detection procedure is reset.

19. The pull-up voltage detection method as claimed in claim 13, wherein the detection procedure is operated during at least one of the following intervals:
- an interval, in which the serial bus is not conducting communication, lying before the serial bus starts conducting a first communication interval and after a power on reset procedure; or
- an interval, in which the serial bus is not conducting communication, lying between two of the communication intervals in which the serial bus is conducting communication.

20. The pull-up voltage detection method as claimed in claim 13, further comprising:
executing a de-bounce operation on the at least one comparison result.

21. The pull-up voltage detection method as claimed in claim 13, wherein each pull-up voltage level of the plural pull-up voltage levels has a corresponding upper limit voltage and a lower limit voltage, wherein a pull-up voltage range corresponding to each pull-up voltage level is defined between the upper limit voltage and the lower limit voltage, wherein each reference voltage in at least one reference voltage falls within the range of two corresponding adjacent pull-up voltage ranges.

22. The pull-up voltage detection method as claimed in claim 13, wherein the serial bus is I2C (Inter-Integrated Circuit) bus.

* * * * *